United States Patent
Yun et al.

(10) Patent No.: US 12,422,403 B2
(45) Date of Patent: Sep. 23, 2025

(54) DEVICE AND METHOD FOR INSPECTING LITHIUM PRECIPITATION IN BATTERY CELL

(71) Applicant: LG ENERGY SOLUTION, LTD., Seoul (KR)

(72) Inventors: Su Hyun Yun, Daejeon (KR); Hyo Sun An, Daejeon (KR); Bum Young Jung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/567,604

(22) PCT Filed: Mar. 21, 2023

(86) PCT No.: PCT/KR2023/003715
§ 371 (c)(1),
(2) Date: Dec. 6, 2023

(87) PCT Pub. No.: WO2023/182769
PCT Pub. Date: Sep. 28, 2023

(65) Prior Publication Data
US 2024/0280539 A1    Aug. 22, 2024

(30) Foreign Application Priority Data
Mar. 22, 2022    (KR) .................. 10-2022-0035169

(51) Int. Cl.
*G01N 27/90*    (2021.01)
*G01N 27/02*    (2006.01)
(Continued)

(52) U.S. Cl.
CPC ....... *G01N 27/9006* (2013.01); *G01N 27/021* (2013.01); *G01R 31/392* (2019.01); *H01M 10/0525* (2013.01); *H01M 10/4285* (2013.01)

(58) Field of Classification Search
CPC ............. G01N 27/9006; G01N 27/021; G01N 27/904; G01N 27/9026; G01N 27/025;
(Continued)

(56) References Cited

U.S. PATENT DOCUMENTS

| | | | |
|---|---|---|---|
| 7,982,457 B2 * | 7/2011 | Redko | G01N 27/9046 324/754.21 |
| 9,263,906 B2 | 2/2016 | Takahashi | |

(Continued)

FOREIGN PATENT DOCUMENTS

| | | |
|---|---|---|
| JP | 1997-113488 A | 5/1997 |
| JP | 2003-083940 A | 3/2003 |

(Continued)

OTHER PUBLICATIONS

International Search Report (with partial translation) and Written Opinion dated Jul. 4, 2023 for International Patent Application No. PCT/KR2023/003715.

*Primary Examiner* — Lee E Rodak
*Assistant Examiner* — Zannatul Ferdous
(74) *Attorney, Agent, or Firm* — Morgan, Lewis & Bockius LLP

(57) ABSTRACT

An apparatus and method for inspecting lithium precipitation may form a magnetic field around a battery cell to be inspected to induce an eddy current and may compare measured impedance of the battery cell with standard data to detect lithium plating in the battery cell, thereby providing high stability and reliability.

14 Claims, 13 Drawing Sheets

(51) Int. Cl.
*G01R 31/392* (2019.01)
*H01M 10/0525* (2010.01)
*H01M 10/42* (2006.01)

(58) Field of Classification Search
CPC .............. G01N 27/9046; G01R 31/392; G01R 31/3644; G01R 31/3648; G01R 31/389; G01R 31/396; H01M 10/0525; H01M 10/4285; H01M 2200/00; H01M 10/48; H01M 10/052; H01M 50/105; H01M 50/251; Y02E 60/10
See application file for complete search history.

(56) References Cited

U.S. PATENT DOCUMENTS

| | | | |
|---|---|---|---|
| 11,143,495 B2 * | 10/2021 | Hughes | G01B 7/105 |
| 11,355,824 B2 * | 6/2022 | Stefanopoulou | H01M 10/486 |
| 11,761,927 B2 | 9/2023 | Kim et al. | |
| 12,259,358 B2 * | 3/2025 | Park | G01N 27/9006 |
| 2017/0285107 A1 * | 10/2017 | Gholam-Abbas | G01R 31/392 |
| 2022/0034843 A1 * | 2/2022 | Kim | G01N 27/9006 |
| 2022/0268734 A1 | 8/2022 | Kim et al. | |
| 2022/0381840 A1 * | 12/2022 | Heo | G01N 27/02 |
| 2023/0113914 A1 | 4/2023 | Min | |

FOREIGN PATENT DOCUMENTS

| | | |
|---|---|---|
| JP | 2009244088 A | 10/2009 |
| JP | 2009252644 A | 10/2009 |
| JP | 2012-212513 A | 11/2012 |
| JP | 2014-059174 A | 4/2014 |
| JP | 2017-003336 A | 1/2017 |
| JP | 2017-036962 A | 2/2017 |
| JP | 6260318 B2 | 1/2018 |
| JP | 6299485 B2 | 3/2018 |
| JP | 6474343 B2 | 2/2019 |
| JP | 2021-077570 A | 5/2021 |
| KR | 10-2009-0071708 A | 7/2009 |
| KR | 10-2012-0114570 A | 10/2012 |
| KR | 10-2018-0125709 A | 11/2018 |
| KR | 10-2019-0097928 A | 8/2019 |
| KR | 10-2023739 B1 | 9/2019 |
| KR | 10-2021-0107997 A | 9/2021 |
| KR | 10-2021-0157224 A | 12/2021 |

* cited by examiner

[Figure 1]
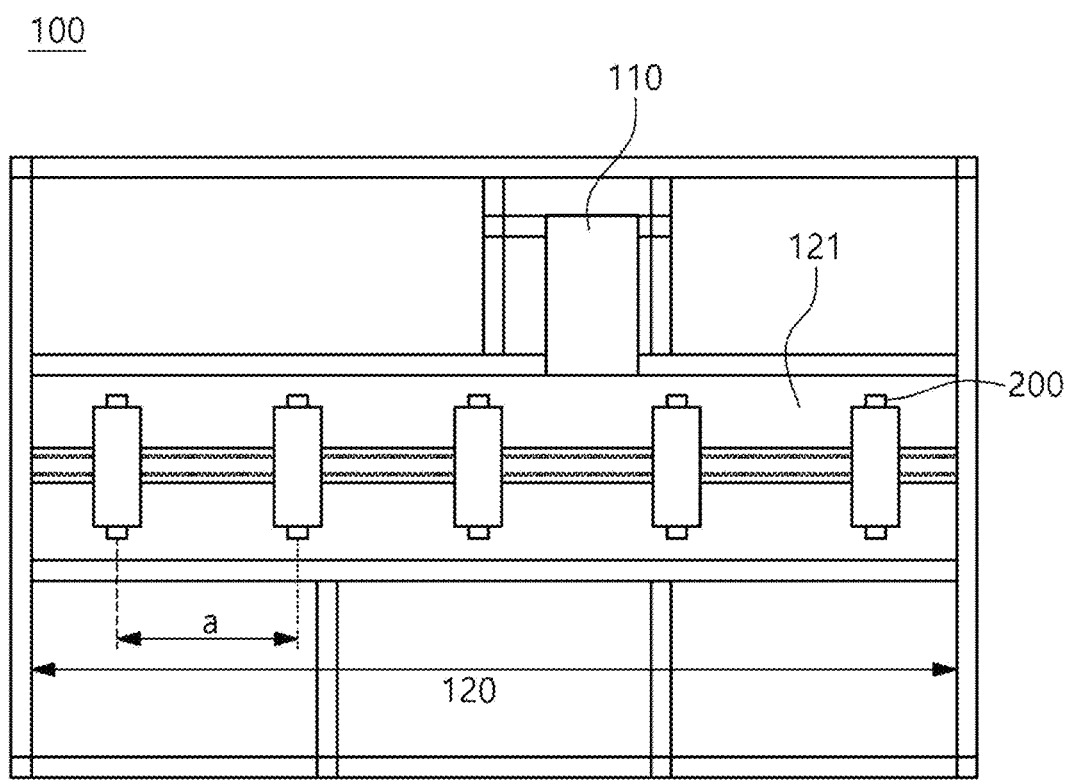

[Figure 2]
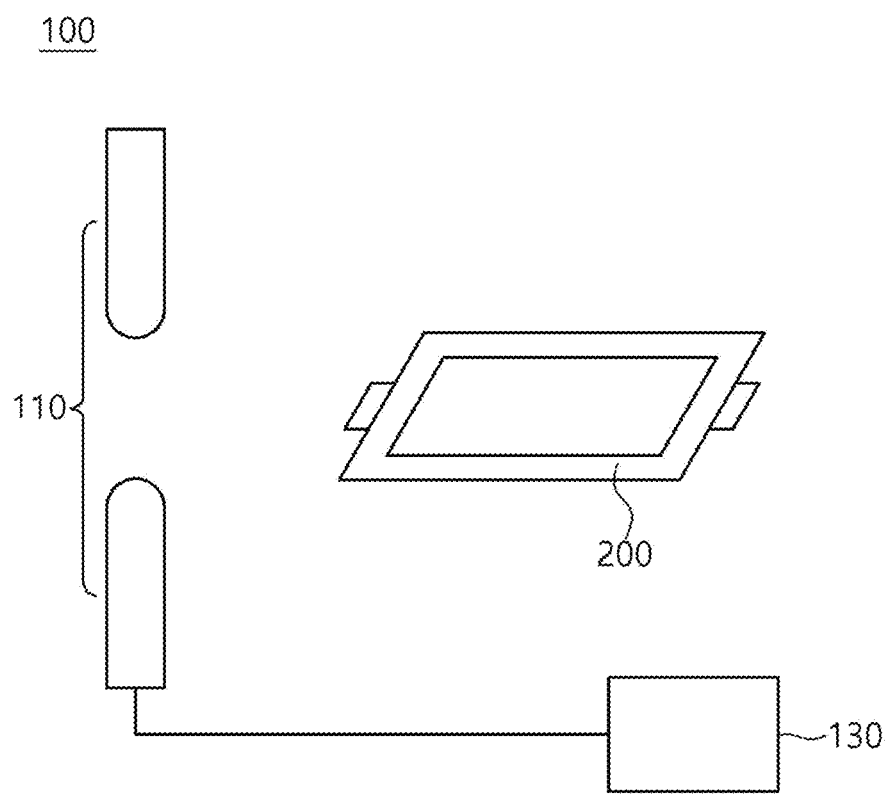

[Figure 3]
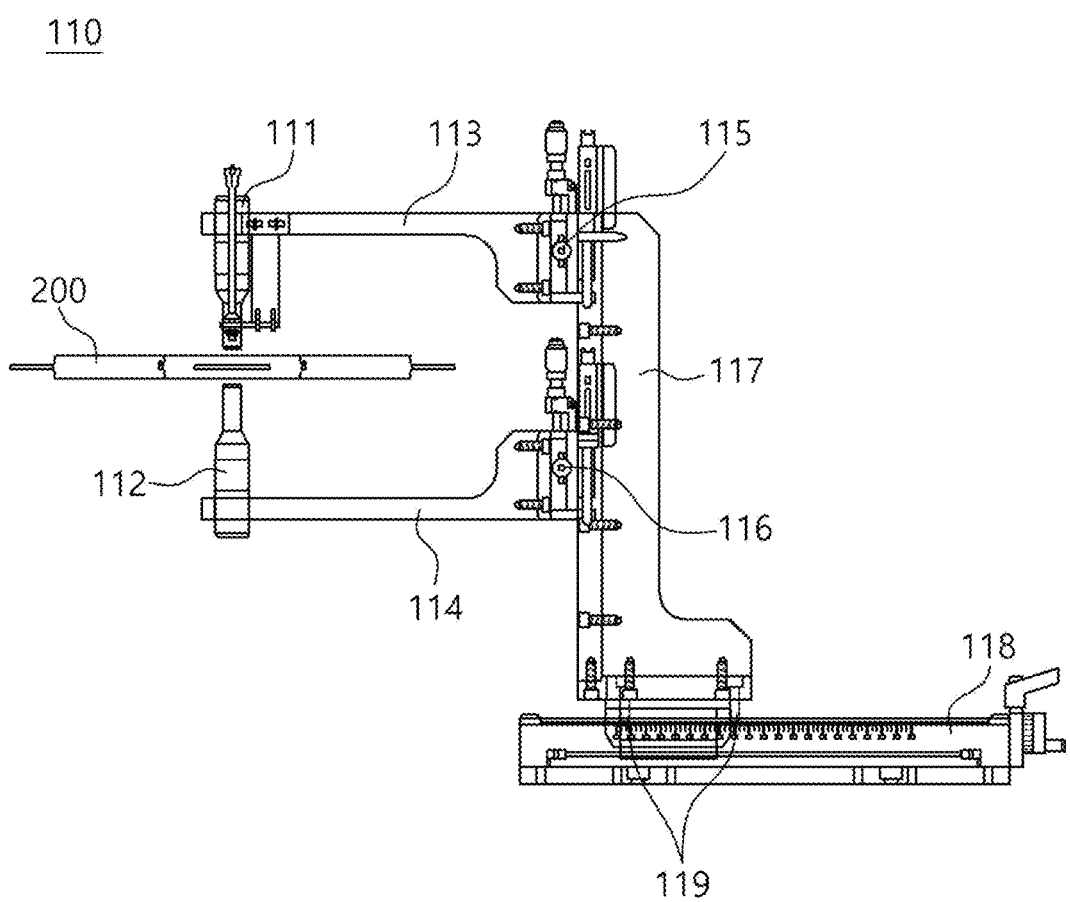

[Figure 4]
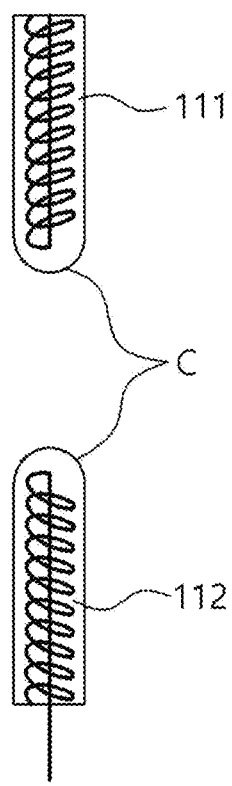

[Figure 5]
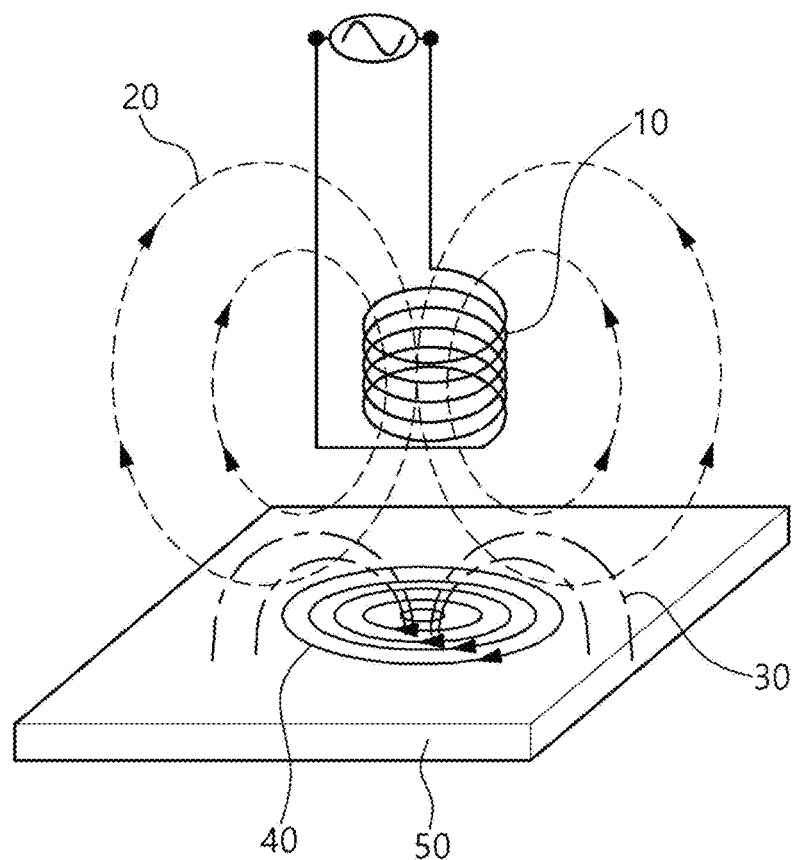
[Figure 6]
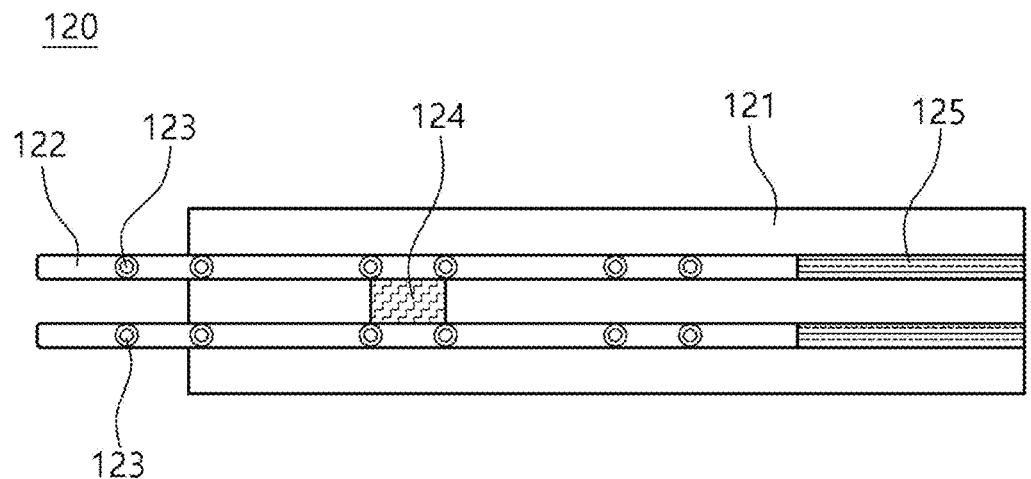

[Figure 7]
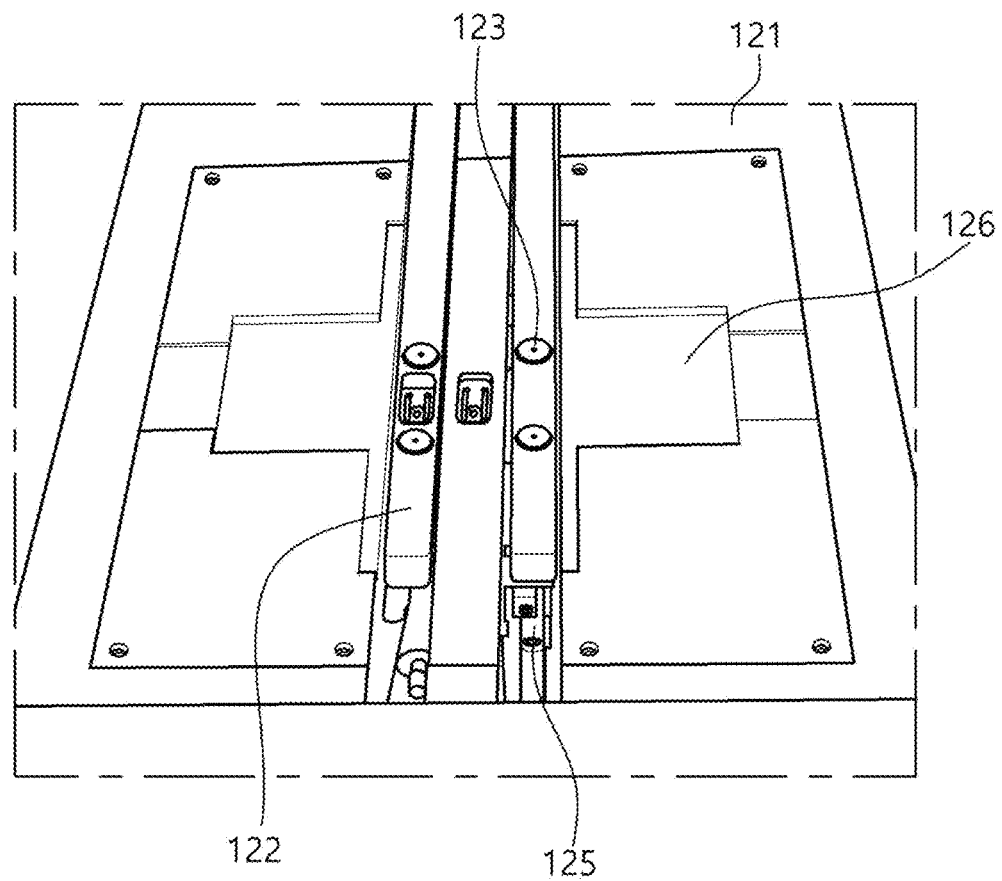

[Figure 8]
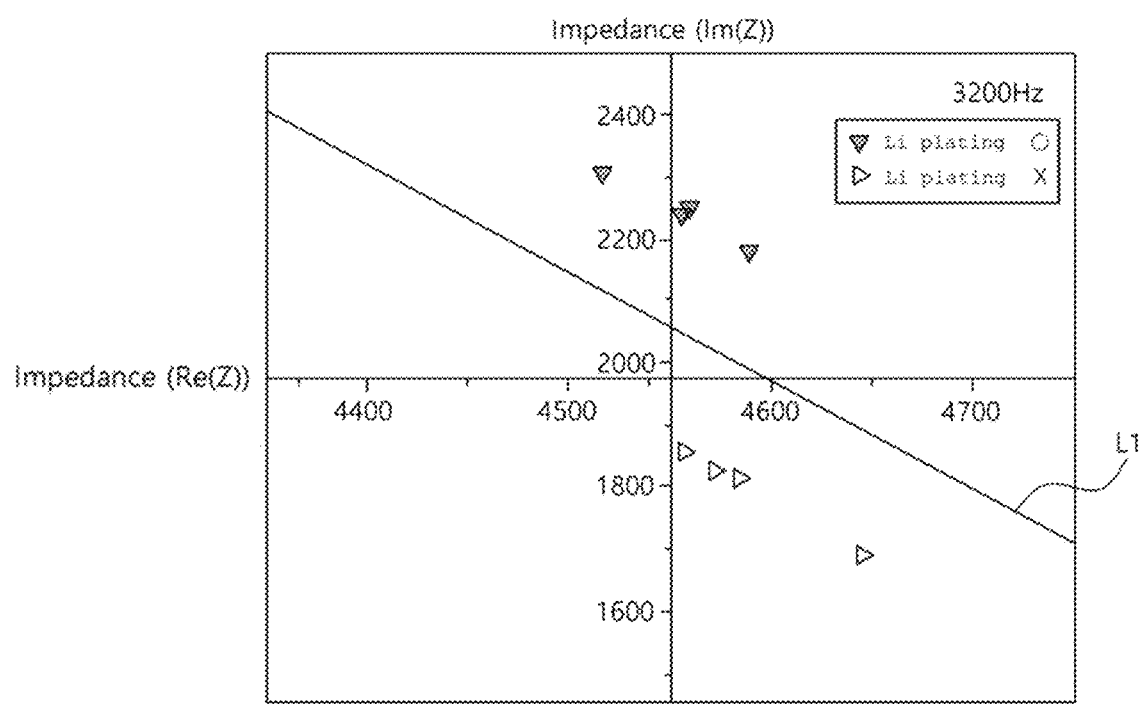

[Figure 9]
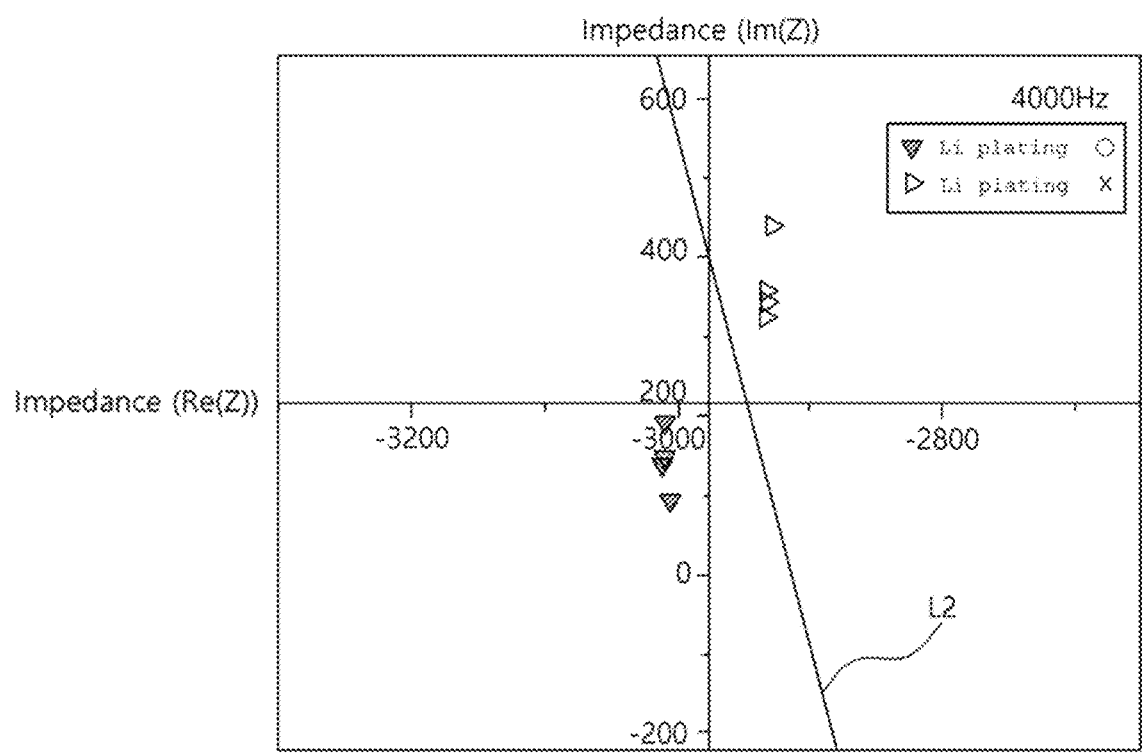

[Figure 10]
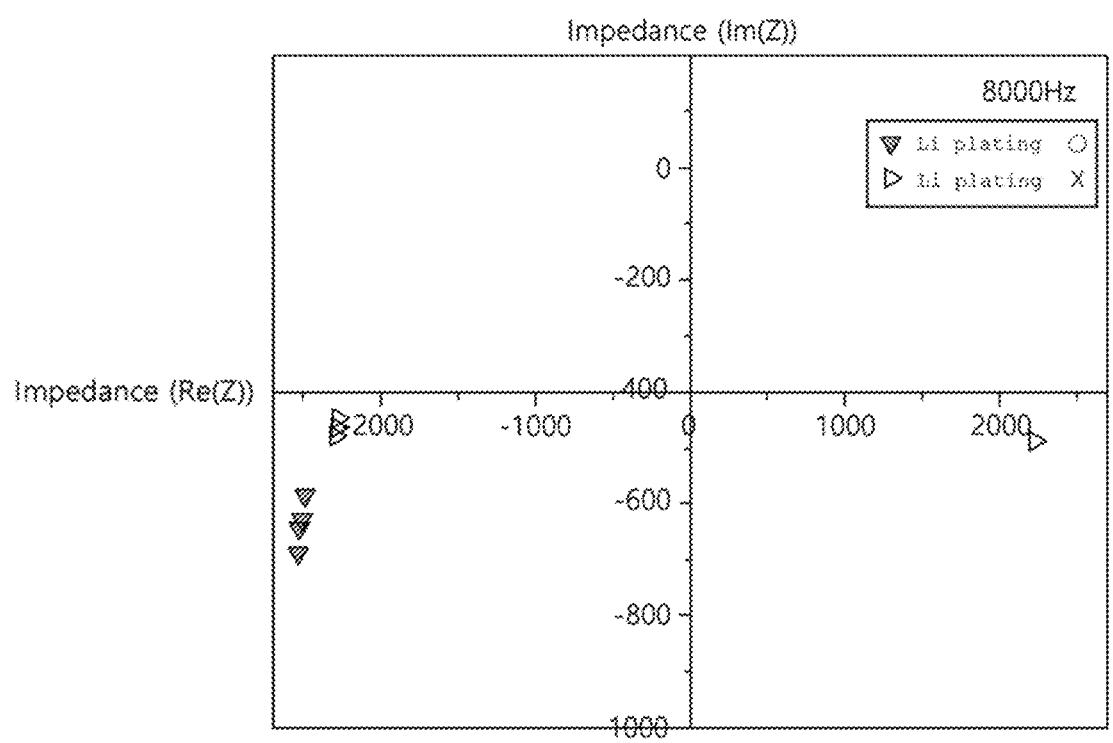

[Figure 11]
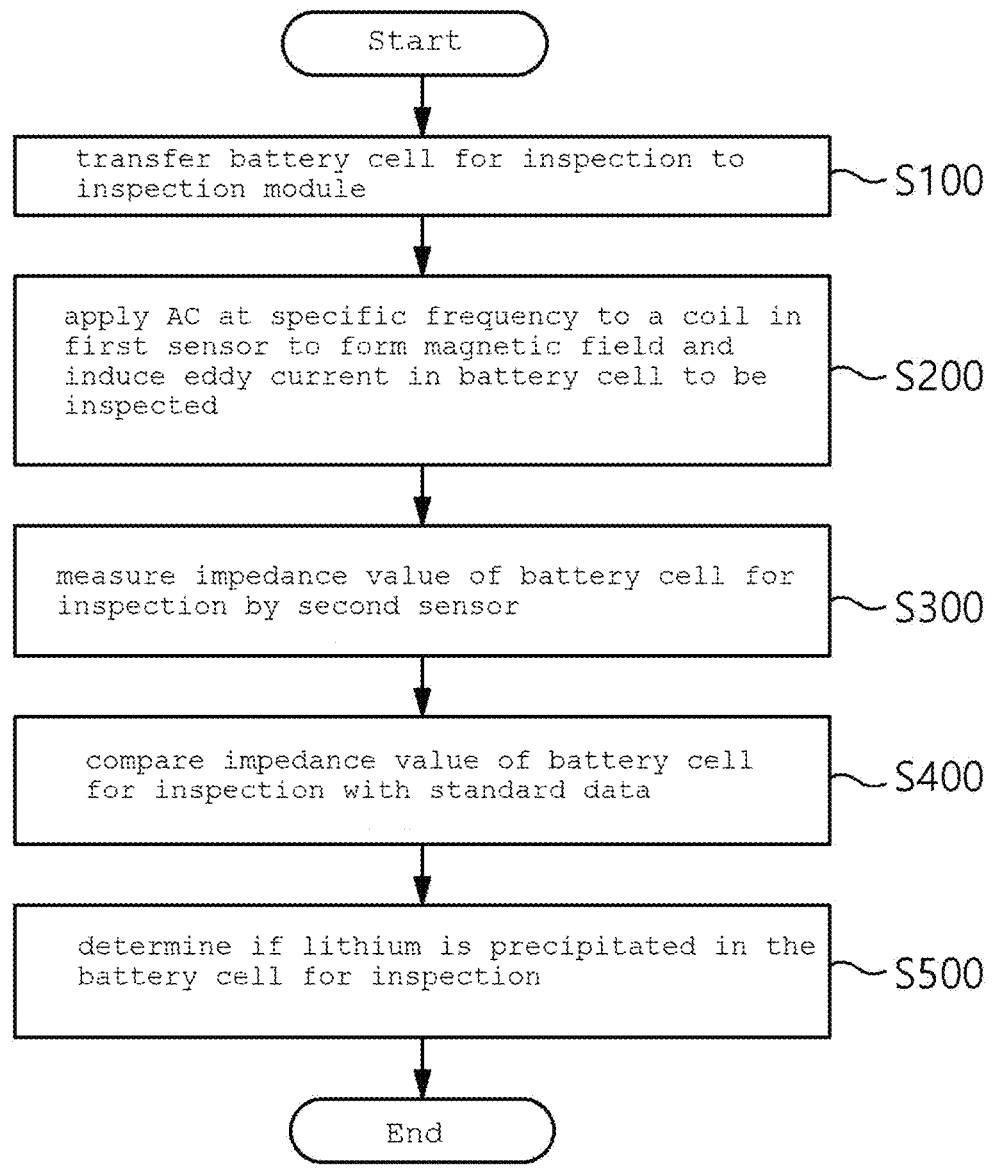

[Figure 12]
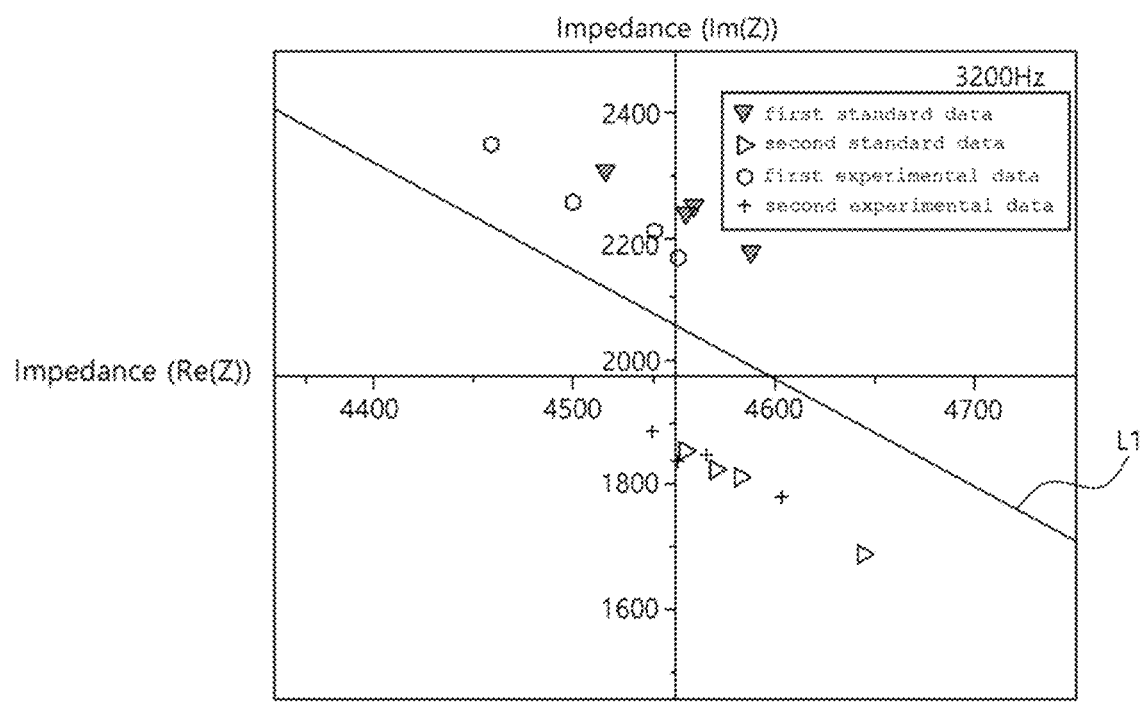

[Figure 13]
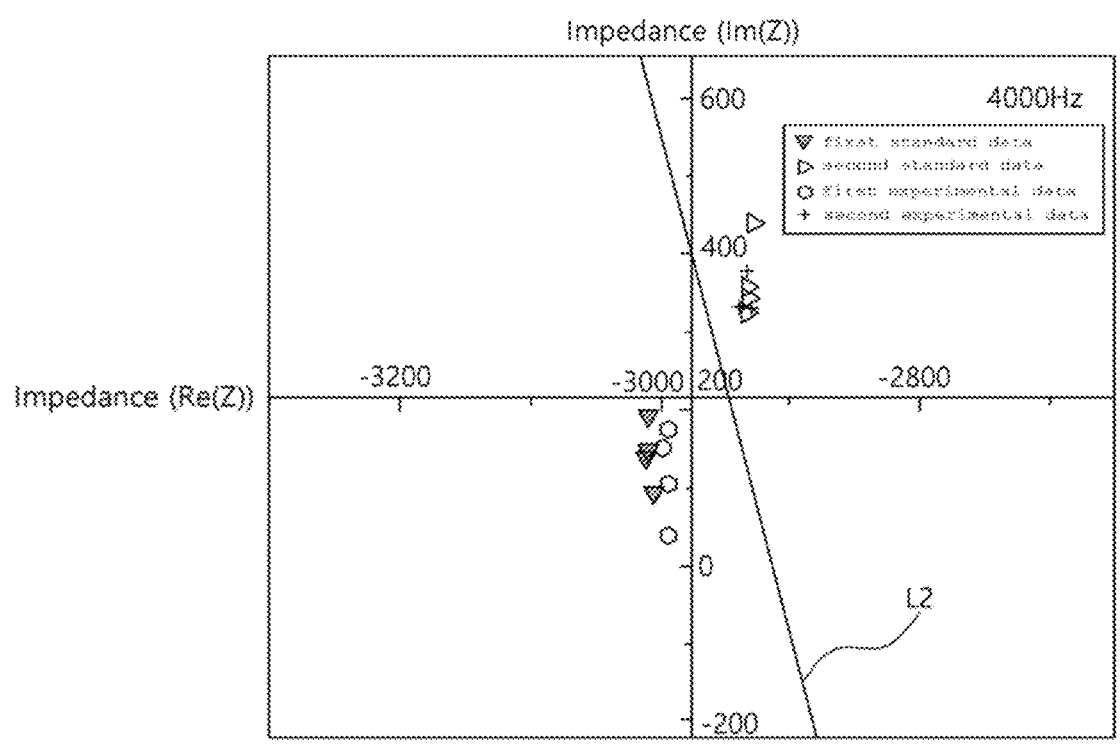

[Figure 14]
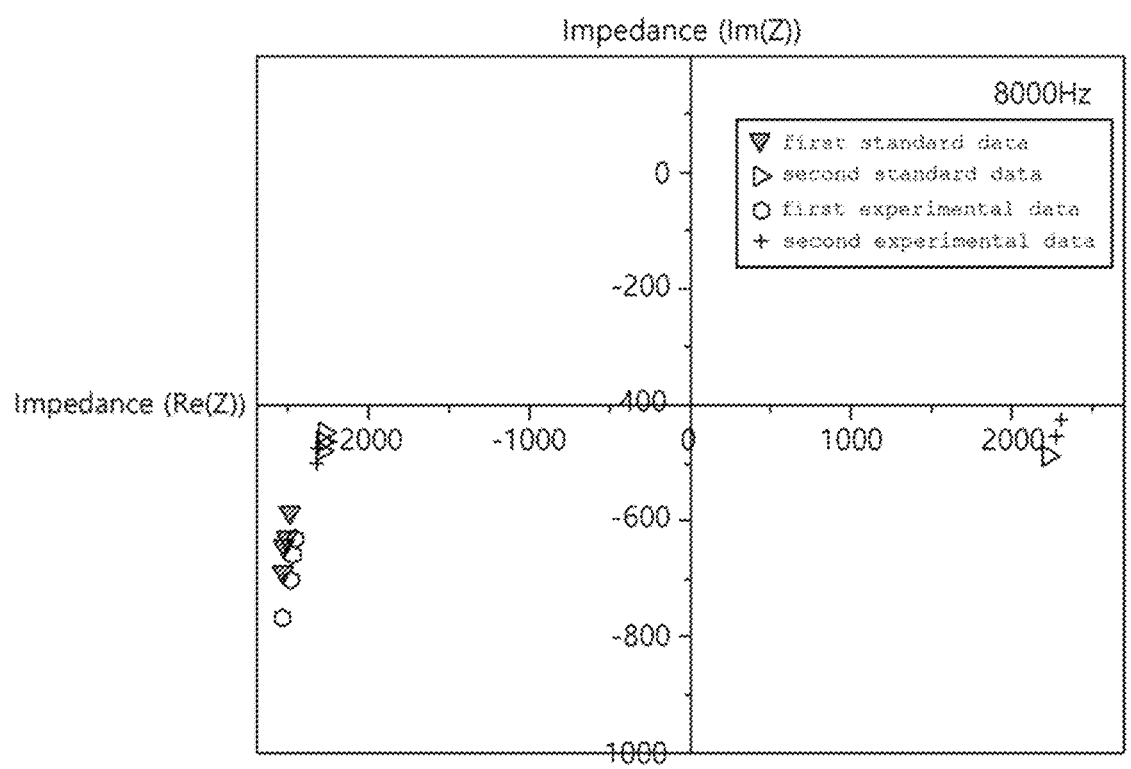

DEVICE AND METHOD FOR INSPECTING LITHIUM PRECIPITATION IN BATTERY CELL

TECHNICAL FIELD

This application claims priority to and the benefit of Korean Patent Application No. 10-2022-0035169 filed in the Korean Intellectual Property Office on Mar. 22, 2022, the entire contents of which are incorporated herein by reference.

The present invention relates to an apparatus and a method for inspecting lithium precipitation in a battery cell, and more particularly, to an apparatus and a method for inspecting lithium precipitation in a battery cell for inspecting whether lithium is deposited inside a secondary battery cell using eddy current.

BACKGROUND ART

As prices of energy sources increase due to depletion of fossil fuels and interests in environmental pollution increase, a demand for eco-friendly alternative energy sources becomes an indispensable factor for future life. In particular, as technology development and demand for mobile devices increase, demand for secondary batteries as an energy source is also rapidly increasing.

Typically, in terms of battery shape, there are high demands for prismatic secondary batteries and pouch-type secondary batteries that can be applied to products such as mobile phones with thin thickness, and, in terms of materials, demands for lithium secondary batteries, such as lithium ion batteries and lithium ion polymer batteries with high energy density, discharge voltage, and output stability, are high.

Among them, a pouch-type lithium secondary battery has a problem in that safety of the battery may be lowered by an internal short circuit caused from local lithium plating occurring within the battery.

Accordingly, it is needed to develop a solution for diagnosing whether or not lithium is deposited in a pouch-type lithium secondary battery.

DETAILED DESCRIPTION OF THE INVENTION

Technical Problem

To obviate one or more problems of the related art, embodiments of the present disclosure provide an apparatus for inspecting lithium precipitation with high reliability.

To obviate one or more problems of the related art, embodiments of the present disclosure also provide a method for inspecting lithium precipitation with high reliability.

Technical Solution

In order to achieve the objective of the present disclosure, an apparatus for inspecting lithium precipitation on battery cell may comprise: an inspection module including a first sensor for inducing an eddy current in the at least one battery cell and a second sensor for measuring impedance of the at least one battery cell in which the eddy current is induced; and a controller configured to determine whether or not lithium plating has occurred in the at least one battery cell by comparing a measured value of the impedance measured by the second sensor with standard data; wherein the first sensor and the second sensor are provided in a form in which a coil is wound around a magnetizing member, wherein the first sensor induces eddy current in the battery cell by applying an alternating current (AC) of a specific predefined frequency to the coil to form a magnetic field, and wherein the second sensor measures an impedance at the specific predefined frequency for the at least one battery cell.

The Apparatus may further include a delivery module for delivering the at least one battery cell input from the outside to the inspection module.

The first sensor is located on the upper side with respect to the delivery module and the second sensor is located on the lower side with respect to the delivery module, and wherein the first sensor and the second sensor are located on a same vertical line with respect to the delivery module.

The specific frequency has a value corresponding to any one value between 3190 Hz to 3210 Hz.

The specific frequency has a value corresponding to any one value between 3990 Hz to 4010 Hz.

The standard data is pre-verified data obtained by measuring impedance at the specific frequency for a battery cell in which lithium is deposited or for a battery cell in which lithium is not deposited.

The controller is configured to compare a position of an impedance value of the battery cell measured by the second sensor on a complex plane with positions of the first cluster data and the second cluster data based on a dividing line which divides the standard data expressed on the complex plane into first cluster data and second cluster data, so as to determine whether lithium is deposited in the battery cell, wherein the first cluster data is at least one piece of data measured in at least one battery cell in which lithium is deposited, and wherein the second cluster data is at least one data measured in at least one battery cell in which lithium is not deposited.

The battery cell is a pouch-type lithium secondary battery cell.

The battery cell is used in an energy storage system (ESS).

In order to achieve the objective of the present disclosure, a method for inspecting lithium precipitation on battery cell using an inspection module including a first sensor and a second sensor in which a coil is wound around a magnetizing member may comprise: applying an alternating current (AC) of a specific predefined frequency to a coil in the first sensor to form a magnetic field and induce eddy current in the at least one battery cell; measuring impedance of the at least one battery cell at the specific predefined frequency using the second sensor; and determining whether or not lithium plating has occurred in the at least one battery cell by comparing an measured impedance value measured by the second sensor with standard data.

The method may further include delivering the at least one battery cell to the inspection module using a delivery module.

The first sensor is located on the upper side with respect to the delivery module, wherein the second sensor is located on the lower side with respect to the delivery module, and wherein the first sensor and the second sensor are located on a same vertical line with respect to the delivery module.

The specific frequency has a value corresponding to any one value between 3190 Hz to 3210 Hz.

The specific frequency has a value corresponding to any one value between 3990 Hz to 4010 Hz.

The standard data is pre-verified data obtained by measuring impedance at the specific frequency for a battery cell in which lithium is deposited or for a battery cell in which lithium is not deposited.

The determining whether or not lithium plating has occurred in the at least one battery cell includes comparing a position of an impedance value of the battery cell measured by the second sensor on a complex plane with positions of the first cluster data and the second cluster data based on a dividing line which divides the standard data expressed on the complex plane into first cluster data and second cluster data, so as to determine whether lithium is deposited in the battery cell, wherein the first cluster data is at least one piece of data measured in at least one battery cell in which lithium is deposited, and wherein the second cluster data is at least one data measured in at least one battery cell in which lithium is not deposited.

The battery cell is a pouch-type lithium secondary battery cell.

The battery cell is used in an energy storage system (ESS).

Advantageous Effects

According to embodiments of the present disclosure, an apparatus and a method for inspecting lithium precipitation forms a magnetic field around a battery cell to be inspected to induce an eddy current and compares measured impedance of the battery cell with standard data to detect lithium plating in the battery cell, thereby providing high stability and reliability.

BRIEF DESCRIPTION OF THE DRAWINGS

FIG. 1 is a plan view of an apparatus for inspecting lithium precipitation according to embodiments of the present invention.

FIG. 2 is a block diagram of an apparatus for inspecting lithium precipitation according to embodiments of the present invention.

FIG. 3 is a design diagram of an inspection module in an apparatus for inspecting lithium precipitation according to embodiments of the present invention.

FIG. 4 is a cross-sectional view of a first sensor and a second sensor in an inspection module according to embodiments of the present invention.

FIG. 5 is a conceptual diagram for explaining eddy current induction principle of a battery cell according to embodiments of the present invention.

FIG. 6 is a plan view of a delivery module in an apparatus for inspecting lithium precipitation according to embodiments of the present invention.

FIG. 7 is an image of a delivery module in an apparatus for inspecting lithium precipitation according to embodiments of the present invention.

FIG. 8 is an impedance measurement graph of standard data when the frequency is 3200 Hz according to a first experimental example of the present invention.

FIG. 9 is an impedance measurement graph of standard data when the frequency is 4000 Hz according to a second experimental example of the present invention.

FIG. 10 is an impedance measurement graph of standard data when the frequency is 8000 Hz according to a comparative example of the present invention.

FIG. 11 is a flow chart of a method for inspecting lithium precipitation according to embodiments of the present invention.

FIG. 12 is an impedance measurement graph of standard data and experimental data when the frequency is 3200 Hz according to a third experimental example of the present invention.

FIG. 13 is an impedance measurement graph of standard data and experimental data when the frequency is 4000 Hz according to a fourth experimental example of the present invention.

FIG. 14 is an impedance measurement graph of standard data and experimental data when the frequency is 8000 Hz according to a fifth experimental example of the present invention.

| | |
|---|---|
| 100: an apparatus for inspecting lithium precipitation | |
| 110: inspection module | |
| 111: first sensor | 112: second sensor |
| 120: delivery module | 121: delivery die |
| 122: lifting unit | 123: adsorption hole |
| 124: driving unit | 125: opening |
| 126: nest | 130: controller |

MODES OF PRACTICE

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "coupled" or "connected" to another element, it can be directly coupled or connected to the other element or an intervening element may be present. In contrast, when an element is referred to as being "directly coupled" or "directly connected" to another element, there is no intervening element present.

Terms used in the present application are used only to describe specific embodiments, and are not intended to limit the present invention. A singular form includes a plural form if there is no clearly opposite meaning in the context. In the present application, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Unless otherwise defined, all terms used herein, including technical and scientific terms, have the same meanings as commonly understood by one skilled in the art to which the present invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

The apparatus for inspecting lithium precipitation according to embodiments of the present invention may detect whether lithium is locally deposited in a region inside a battery cell by using eddy current. Here, the battery cell may be a pouch type lithium secondary battery for an energy storage system (ESS).

In general, lithium secondary batteries may be classified according to a structure of an electrode assembly having a anode/separator/cathode structure. For example, a lithium secondary battery may be classified as having a jelly-roll (wound type) electrode assembly having a structure in which long sheet-shaped positive (anode) and negative electrodes (cathode) are wound with a separator interposed therebetween, a stack type (stack type) electrode assembly in which a plurality of anodes and cathodes cut in units of a predetermined size are sequentially stacked with a separator interposed therebetween, or a stack/folding type electrode assembly having a winding structure of bi-cells or full cells in which positive and negative electrodes of a predetermined unit are stacked with a separator interposed therebetween.

Recently, a pouch type battery, having a structure in which a stack type or stack/fold type electrode assembly is embedded in a pouch type battery case of an aluminum laminate sheet has attracted a lot of attention due to low manufacturing cost, low weight, easy shape deformation, etc., and thus, use of the pouch type battery is steadily increasing.

In general, a pouch-type lithium secondary battery is configured to include an electrode assembly, electrode tabs extending from the electrode assembly, electrode leads welded to the electrode tabs, and a battery case accommodating the electrode assembly.

Here, the electrode assembly is a power generating device in which a positive electrode and a negative electrode are sequentially stacked with a separator interposed therebetween, and has a stacked or stacked/folded structure. In addition, the electrode tabs may extend from each electrode plate of the electrode assembly and the electrode lead may be electrically connected to a plurality of electrode tabs extending from each electrode plate by welding.

Meanwhile, a portion of the battery case is exposed to the outside, and an insulating film may be attached to a portion of the upper and lower surfaces of the electrode lead to increase sealing with the battery case and at the same time secure electrical insulation.

In general, a battery case is made of an aluminum laminate sheet, provides a storage space for accommodating an electrode assembly, and has a pouch shape as a whole. Here, in a case of the stacked electrode assembly, the upper end of the battery case is spaced apart from the electrode assembly so that the plurality of positive electrode tabs and the plurality of negative electrode tabs can be coupled to the electrode lead.

Somehow, safety of the lithium secondary battery may deteriorate when lithium is deposited in any one region within the battery cell. Among them, a pouch-type lithium secondary battery has a disadvantage in that it is difficult to confirm whether or not lithium is deposited from the outside because the electrode, the electrode tab, and the welding part are accommodated inside the battery case as described above.

In the following, an apparatus for detecting lithium plating which is capable of easily determining presence or absence of lithium plating in a pouch-type secondary battery using eddy current will be described in more detail with reference to the accompanying drawings.

FIG. 1 is a plan view of an apparatus for inspecting lithium precipitation according to embodiments of the present invention, FIG. 2 is a block diagram of an apparatus for inspecting lithium precipitation according to embodiments of the present invention, and FIG. 3 is a design diagram of an inspection module in an apparatus for inspecting lithium precipitation according to embodiments of the present invention.

Referring to FIGS. 1 to 3, the apparatus for inspecting lithium precipitation 100 may include an inspection module 110, a delivery module 120 and a controller 130.

The inspection module 110 may include a first sensor 111 and a second sensor 112 to measure impedance of the battery cell 200 in which eddy current is induced at a specific frequency.

The delivery module 120 may deliver at least one battery cell 200 to be tested, which is input from the outside, to the inspection module 110 to inspect whether or not lithium is precipitated.

In addition, the controller 130 may control operations of the inspection module 110 and the delivery module 120, and determine whether or not lithium is deposited in the test target battery cell 200 based on a impedance measurement value obtained from the inspection module 110.

FIG. 4 is a cross-sectional view of a first sensor and a second sensor in an inspection module according to embodiments of the present invention.

Referring to FIG. 4, the inspection module 110 may include a first sensor 111 and a second sensor 112. According to the embodiment, the first sensor 111 and the second sensor 112 may be formed in a structure in which a coil is wound around a magnetizing member (not shown) having magnetism. Here, the diameter of the coil may be 0.5 to 10 mm. For example, when the diameter of the coil is less than 0.5 mm, an impedance measurement value measured by the second sensor 112 to be described later may be low. On the contrary, when the diameter of the coil exceeds 10 mm, noise may be generated in the impedance measurement value measured by the second sensor 112, and thus reliability may deteriorate. Accordingly, in order to determine whether or not lithium is deposited inside the battery cell 200, a user may select an optimal coil diameter by appropriately adjusting the diameter of the coil within the numerical range described above.

In addition, the inspection module 110 may further include a case C to protect the first sensor 111 and the second sensor 112. For example, the case C may be provided in a cylindrical shape with one end closed and the other open. Here, one end may be an end positioned close to an object to be inspected.

FIG. 5 is a conceptual diagram for explaining eddy current induction principle of a battery cell according to embodiments of the present invention.

Referring to FIG. 5, the first sensor 111 may be a sensor for inducing eddy current in the battery cell 200 to be inspected.

More specifically, according to the embodiments, when an alternating current at a specific frequency is applied to the coil by the controller 130 to be described later, magnetic field may be formed around the coil of the first sensor 111. For example, the specific frequency may be any one value from 3190 Hz to 3210 Hz, or any one value from 3990 Hz to 4010 Hz.

Subsequently, when the battery cell 200 to be inspected is located within a magnetic field area by the delivery module 120 to be described later, induced electromotive force may be generated in the battery cell 200 due to electromagnetic induction. Accordingly, an eddy current that disturbs the magnetic field may flow through the battery cell 200.

Referring back to FIGS. 3 and 4, the second sensor 112 may be positioned on a vertical line corresponding to the first sensor 111 with respect to the delivery module 120. In other words, the first sensor 111 and the second sensor 112 are located on the same vertical line with respect to the delivery module 120, the first sensor 111 is located in the upper side with respect to the delivery module 120 and the second sensor 112 may be located in the lower side with respect to the delivery module 120. Accordingly, the second sensor 112 may measure impedance in the battery cell 200 in which eddy current is induced by the first sensor 111. Here, the eddy currents may show difference in measured values according to resistance in the measurement area.

Meanwhile, the inspection module 110 may further include first to fourth position adjusting members 113, 114, 117, and 118. Here, the first to fourth position adjusting members 113, 114, 117, and 118 may be configured to move the positions of the first sensor 111 and the second sensor 112.

More specifically, one side of the first position adjusting member 113 may be coupled to the first sensor 111, and the other side of the first position adjusting member 113 may be coupled to the third position adjusting member 117 by a position fixing bolt 115.

In addition, one side of the second position adjusting member 114 may be coupled to the second sensor 112 and the other side of the second position adjusting member 114 may be coupled to the third position adjusting member 117 by a position fixing bolt 116.

Meanwhile, one side of the third position adjusting member 117 may be coupled to the first position adjusting member 113 and the second position adjusting member 114, and the other side may be combined with the fourth positioning member 118 by a position fixing bolt 119.

Here, the first position adjusting member 113 and the second position adjusting member 114 may be spaced apart from one side of the third position adjusting member 117 by a predetermined distance and coupled thereto.

The third position adjusting member 117 may include a sliding groove (not shown) of a predetermined length on one side for adjusting a position of the first position adjusting member 113 and a position of the second position adjusting member 114.

In other words, the third position adjusting member 117 may include a first sliding groove (not shown) at a part coupled to the first position adjusting member 113. Accordingly, the first position adjusting member may move in a vertical direction along the first sliding groove within a length range of the first sliding groove.

In addition, the third position adjusting member 117 may include a second sliding groove (not shown) at a part coupled to the second position adjusting member 114. Accordingly, the second position adjusting member 114 may move in a vertical direction along the second sliding groove within a length range of the second sliding groove.

Thus, the first position adjusting member 113 and the second position adjusting member 114 may move in a vertical direction, respectively, along the first and second sliding grooves of the third position adjusting member 117 under control of the controller 130. In other words, the controller 130 moves the first position adjusting member 113 and the second position adjusting member 114 in a vertical direction, respectively, so that the first sensor 111 and the second sensor 112 may be adjusted to be closer or farther to a battery to be inspected on a cell-by-cell basis.

In addition, vertical direction movements of the first sensor 111 and the second sensor 112 may be fixed by the position fixing bolts 115 and 116 of the first position adjusting member 113 and the second position adjusting member 114. According to an embodiment, a user may adjust the position of the first position adjusting member 113 and the second position adjusting member 114, and then tighten the position fixing bolts 115 and 116 that are coupled with the third position adjusting member 117, thereby fixing the movements of the first sensor 111 and the second sensor 112.

Meanwhile, the fourth position adjusting member 118 may be coupled to the third position adjusting member 117 by a position fixing bolt 119.

More specifically, the fourth position adjusting member 118 may include a third sliding groove having a predetermined length for adjusting a position of the third position adjusting member 117. Accordingly, the third position adjusting member 117 may move in a horizontal direction along the third sliding groove within a length range of the third sliding groove.

In addition, the fourth position adjusting member 118 may further include a position fixing bolt 119. Accordingly, a user may move the third position adjusting member 117 to a desired position through the third sliding groove, and fix the third position adjusting member 117 to the fourth position adjusting member 118 by manipulating the position fixing bolt 119. Accordingly, the third position adjusting member 117 may fix horizontal movement of the first sensor 111 and the second sensor 112 coupled to the third position adjusting member 117.

FIG. 6 is a plan view of a delivery module in an apparatus for inspecting lithium precipitation according to embodiments of the present invention and FIG. 7 is an image of a delivery module in an apparatus for inspecting lithium precipitation according to embodiments of the present invention.

Referring to FIGS. 6 and 7, the delivery module 120 may transfer the battery cell 200 which is put into the lithium precipitation inspection apparatus 100 according to embodiments of the present invention toward the inspection module 110. In addition, the delivery module 120 may transfer the inspected battery cell 200 to a carrying-out port.

While the inspection module 110 measures impedance of the battery cell being inspected, the delivery module 120 may transfer a following battery cell to a position where the battery cell being inspected was stayed immediately before. Accordingly, the following battery cell may have a certain waiting time for inspection. Thereafter, when the inspection of the battery cell ends and the battery cell moves out of the inspection area, the delivery module 120 may transfer the following battery cell into the inspection area. Accordingly, the inspection module 110 may measure impedance according to a specific frequency of the battery cell.

In addition, the delivery module 120 may control a traveling speed of a specific battery cell within the inspection area and a traveling speed of a battery cell outside the inspection area differently, by the controller 130 to be described later. For example, the traveling speed of a battery cell to be tested within the inspection area may be slower than the traveling speed of battery cells located out of the inspection area.

The delivery module 120 may include a transfer die 121 extending from an input point of the battery cell to a discharge point, and transfer means 122, 123, and 124 for transferring the battery cell.

Here, the transfer die 121 may include a plurality of nests 126 in which the battery cells 200 are seated between one unit movement section and an adjacent unit movement section.

The nest 126 may be a receiving groove recessed into the transfer die 121 to correspond to a shape of the battery cell, and thus, the battery cell 200 can be seated therein. Accordingly, when the delivery module 120 is moving, the battery cells may be aligned by being seated in the nest and transported from the input point to the inspection area.

Meanwhile, the transfer means 122, 123, and 124 include a lifting unit 122 that lifts the battery cell from the transfer die 121 and a driving unit 124 that transfers the lifting unit 122 in a traveling direction of the battery cell 200. Here, the driving unit 124 may be implemented in various forms for moving the lifting unit 122.

The lifting unit 122 may be a cylinder reciprocating up and down by hydraulic pressure or pneumatic pressure.

The lifting unit 122 may be provided in a form of two narrow rods extending in a direction parallel to the traveling direction of the battery cell 200 and having a predetermined length. According to the embodiment, the lifting unit 122 may be spaced apart from each other above and below a central line parallel to a longitudinal direction of the transfer die 121 (the traveling direction of the battery cell).

The lifting unit 122 may support the battery cell 200 and transfer the battery cell 200 while moving in the traveling direction of the battery cell 200 as the driving unit 124 moves.

The lifting unit 122 according to embodiments of the present invention may include one or more adsorption holes 123 for adsorbing the battery cell 200. Here, the number of adsorption holes 123 may be properly adjusted as needed.

The lifting unit 122 may be extended and elevated by the driving unit 124 to adsorb the battery cell 200 in order to pick up the battery cell 200.

The driving unit 124 may be located on a lower surface with respect to the transfer die 121. The driving unit 124 may pass through an opening 125 formed in the transfer die 121 and ascend to the top of the transfer die 121 according to a control signal from the controller 130 to be described later. Then, the controller 130 to be described later may fix the battery cell 200 to the lifting unit 122 by applying a vacuum to the adsorption holes 123.

The apparatus for inspecting lithium precipitation according to embodiments of the present invention provides the lifting unit 122 including adsorption holes 123, so that vibration of the battery cell 200 being transported through the lifting unit 122 may be suppressed, thereby preventing the battery cell 200 from being disturbed in alignment or from being detached from the lifting unit 122. Therefore, the apparatus for inspecting lithium precipitation according to the embodiments of the present invention may be able to measure an impedance value with high reliability even during transfer of the battery cell. However, the apparatus for inspecting lithium precipitation according to embodiments of the present invention is not limited to an embodiment in which the battery cell 200 is adsorbed to the lifting unit 122 by applying vacuum through the adsorption holes 123, but may have various forms in which the battery cell 200 can be fixed to the lifting unit 122.

Meanwhile, the delivery module 120 of the apparatus for inspecting lithium precipitation according to embodiments of the present invention may include a plurality of unit movement sections, and the transfer means 122, 123, and 124 may travel back and forth one unit movement section or two or more unit movement sections.

For example, the transfer means 122, 123, and 124 may pick up a battery cell placed at a starting point of a unit movement section and transport it to a starting point of an adjacent unit movement section. Thereafter, the transfer means 122, 123, and 124 that have completed transfer of the battery cell 200 in the unit movement section may return to the starting point of the unit movement section. In other words, the delivery module 120 may sequentially transfer a plurality of battery cells 200 by repeatedly performing the above process.

Explaining a process in which a battery cell 200 to be inspected is put into and taken out of the apparatus for inspecting lithium precipitation according to embodiments of the present invention in detail, when a battery cell is put in a nest 126 located at a battery cell input point, the driving unit 124 may operate the lifting unit 122. Accordingly, the lifting unit 122 may pass through the opening 125 of the transfer die 121 and moved upward to the top of the transfer die 121.

Thereafter, the lifting unit 122 raised to the upper part of the transfer die 121 may adsorb the battery cell 200 seated on the nest 126. Accordingly, the battery cell 200 can be prevented from being detached from the lifting unit 122 or out of alignment during transfer and movement due to vibration during inspection can be minimized. A method of adsorbing the battery cell 200 by the lifting unit 122 is not limited to the above-described embodiment as long as movement of the battery cell 200 during transfer can be minimized.

The lifting unit 122 is coupled to the driving unit 124 and can be reciprocally moved by the driving unit 124.

Accordingly, the lifting unit 122 adsorbing the battery cell 200 may move, by the driving unit 124, horizontally in a direction in which the inspection module 110 is installed while maintaining a raised state. Thus, the battery cell 200 supported or adsorbed by the lifting unit 122 may be transferred together. Accordingly, one battery cell 200 may be transferred from one unit movement section to an adjacent unit movement section.

The lifting unit 122 may release the vacuum after transferring the battery cell 200 to an adjacent nest 126. Thereafter, the lifting unit 122 may descend to a lower part of the transfer die 121 together with the driving unit 124 and return to its original position.

Thereafter, the delivery module 120 according to embodiments of the present invention may sequentially repeat the above process to transfer a battery cell 200 from an inlet to a nest 126 closest to the inspection module 110.

Meanwhile, the apparatus for inspecting lithium precipitation according to embodiments of the present invention may further include an alignment module (not shown) for aligning the battery cell 200 seated in the nest 126 closest to the inspection module 110.

The aligning module may align the battery cell 200 immediately before performing an eddy current inspection, thereby improving reliability of the inspection.

The battery cell 200 aligned by the aligning module may be adsorbed to the lifting unit 122 again. Accordingly, impedance of the battery cell 200 may be measured by the inspection module 110 including a first sensor 111 and a second sensor 112 in a state in which eddy current is induced at a specific frequency.

It is preferable that a traveling speed of the battery cell 200 within the inspection area by the inspection module 110 is constant to increase accuracy of the inspection. In addition, the traveling speed of the battery cell 200 during passing through the inspection area may be controlled differently from a transfer speed of the battery cell 200 located on the transfer die outside the inspection area.

Thereafter, the battery cell 200 for which impedance measurement has been completed by the inspection module 110 may be transported to an outlet by means of transfer means 122, 123, and 124.

Referring back to FIG. 2, the controller 130 is electrically connected to the inspection module 110. Accordingly, the controller 130 may receive an impedance measurement value of the battery cell 200 to be inspected, in which eddy current is induced at a specific frequency, from the inspection module 110 to determine whether or not lithium is deposited in the battery cell 200. More specifically, the controller 130 may compare the eddy current impedance measurement value of the battery cell 200 being inspected received from the inspection module 110 with standard data to determine whether or not lithium is deposited in the battery cell. Here, the standard data may be pre-verified data obtained by measuring impedance at a specific frequency of a battery cell in which lithium is precipitated or a battery cell in which lithium is not precipitated. A method of determining whether lithium is deposited in a battery cell being inspected using standard data will be described in detail below.

Standard Data Acquisition Experiment According to Experimental Examples

Targeting a pouch-type lithium-ion battery cell with a battery capacity of 60 Ah in a form of a bidirectional tab, 4 newly manufactured battery cells in which are confirmed by CT measurement that lithium plating has not occurred and 4 battery cells in which are confirmed by CT measurement that lithium plating has occurred were prepared.

Thereafter, impedances of the battery cells for each frequency were individually measured using an eddy current sensor for the battery cells.

Here, the battery cells were arranged so that a boundary between a positive electrode tab and an electrode plate was positioned at the center of the eddy current sensor, and the battery cells were fixed to maintain a 1 mm gap from the eddy current sensor, and then individual impedances of the battery cells were measured.

FIG. 8 is an impedance measurement graph of standard data when the frequency is 3200 Hz according to a first experimental example of the present invention, FIG. 9 is an impedance measurement graph of standard data when the frequency is 4000 Hz according to a second experimental example of the present invention, and FIG. 10 is an impedance measurement graph of standard data when the frequency is 8000 Hz according to a comparative example of the present invention.

Referring to FIG. 8, when the frequency is 3200 Hz, the measured impedance values of battery cells in which lithium is precipitated are clustered in quadrants 1 and 2 on a complex plane graph, and the measured impedance values of battery cells in which lithium is not precipitated are clustered in quadrants 3 and 4. In other words, when the frequency is 3200 Hz, the measured impedance values of the battery cells in which lithium is deposited may be clustered in the upper side with respect to a first linear dividing line L1, and the measured impedance values of the battery cells in which lithium is not deposited may be clustered and positioned in the lower side of the first linear dividing line L1.

In addition, referring to FIG. 9, when the frequency is 4000 Hz, the measured impedance values of battery cells in which lithium is precipitated are clustered in quadrant 3 on a complex plane graph, and the measured impedance values of battery cells in which lithium is not precipitated are clustered in quadrant 1. In other words, when the frequency is 4000 Hz, the measured impedance values of the battery cells in which lithium is deposited may be clustered in the left side with respect to a second linear dividing line L2, and the measured impedance values of the battery cells in which lithium is not deposited may be clustered and positioned in the right side of the second linear dividing line L2.

On the other hand, referring to FIG. 10, when the frequency is 8000 Hz, it can be seen that the impedance measurement values of lithium-precipitated battery cells and the impedance measurement values of non-lithium-precipitated battery cells are scattered rather than clustered with each other. Accordingly, when the frequency is 8000 Hz, it is not possible to obtain a linear dividing line dividing impedance measurement values of lithium-precipitated battery cells and impedance measurement values of non-lithium-precipitated battery cells.

In addition, although not shown in the figures, in addition to 8000 Hz, at frequencies outside a range from 3190 Hz to 3210 Hz and outside a range from 3990 Hz to 4010 Hz, the impedance measurement values of lithium-precipitated battery cells and the impedance measurement values of non-lithium-precipitated battery cells are scattered rather than clustered, so it is difficult to distinguish them from each other using a dividing line.

Accordingly, the apparatus for inspecting lithium precipitation according to embodiments of the present invention may determine whether or not lithium is deposited in the battery cell by checking a position of the impedance measurement value of the battery cell being inspected at specific frequencies range based on a dividing line obtained from standard data of impedances of the battery cells measured in advance at the specific frequencies. According to an embodiment, the specific frequency may be any one value within a range of 3190 Hz to 3210 Hz or a range of 3990 Hz to 4010 Hz.

Meanwhile, the controller 130 may control the inspection module 110 and the transfer means 122, 123, and 124. The controller 130 may be implemented as a conventional programmable electronic computer combined with a memory for controlling transfer and transfer speed of the plurality of battery cells 200. According to an embodiment, the controller 130 may be provided as a processor that executes at least one program command stored in a memory. Here, the processor may mean a central processing module (CPU), a graphics processing module (GPU), or a dedicated processor on which methods according to embodiments of the present invention are performed.

The apparatus for inspecting lithium precipitation according to embodiments of the present invention has been described above. Hereinafter, a method for inspecting lithium precipitation according to embodiments of the present invention with regard to operations of the controller in the apparatus for inspecting lithium precipitation will be described.

FIG. 11 is a flow chart of a method for inspecting lithium precipitation according to embodiments of the present invention.

Referring to FIG. 11, the controller 130 in the apparatus for inspecting lithium precipitation may transfer the battery cell for inspection, which is input from the outside by the delivery module 120, to the inspection module 110 (S100). A detailed method of transferring the battery cell for inspection to the inspection module 110 by using the delivery module 120 is same with the description stated above with regard to the apparatus for inspecting lithium precipitation, and thus, it will be omitted.

Thereafter, the controller 130 may operate the first sensor 111 of the inspection module 110 to induce eddy current in the battery cell 200 (S200).

In more detail according to the embodiments, the controller 130 may apply an alternating current at a specific frequency to a coil in the first sensor 111. Accordingly, a magnetic field may be formed around the battery cell 200. Here, the specific frequency may be any one of values from 3190 Hz to 3210 Hz, or any one of values from 3990 Hz to 4010 Hz.

Then, the controller 130 may locate the first sensor 111 close to the battery cell 200. Accordingly, induced electromotive force may be generated around the battery cell 200 due to electromagnetic induction, and eddy current may flow in the battery cell 200 in a direction obstructing the magnetic field.

The controller 130 may measure impedance of the battery cell 200 to which the eddy current is induced using a second sensor 112 located close to the battery cell 200 together with the first sensor 111 (S300).

Thereafter, when measurement of the impedance of the battery cell 200 by the second sensor 112 is completed, the controller 130 may move the first sensor 111 and the second sensor 112 which are located close to the battery cell to an initial position to maintain a certain distance from to the battery cell 200.

In addition, the controller 130 may compare the measured impedance value of the battery cell obtained by the second sensor 112 to standard data (S400). Here, the standard data may be pre-verified data obtained by measuring impedance at the specific frequency for a battery cell in which lithium is precipitated or a battery cell in which lithium is not precipitated. Here, the specific frequency may be the same value as the specific frequency applied to the coil in the first sensor.

Accordingly, the controller 130 may determine whether or not lithium in the battery cell is precipitated (S500).

According to an embodiment, the controller 130 may compare the impedance measurement value of the battery cell obtained from the second sensor 112 with the standard data in real time to determine whether lithium is deposited in the battery cell in real time.

According to another embodiment, the controller 130 may collect impedance measurement values of the battery cell obtained from the second sensor 112 according to a predetermined criteria set by a user. Thereafter, the controller 130 may compare the collected impedance measurement values of the plurality of battery cells with the standard data to determine whether lithium is deposited in each battery cell. For example, the predetermined criteria may be time or a number of battery cells whose impedances are measured by the second sensor.

Describing a method for determining whether lithium is precipitated in a battery cell in more detail, the apparatus for inspecting lithium precipitation according to embodiments of the present invention may pre-acquire a dividing line at a corresponding frequency, obtained from pre-measured standard data for each frequency. For example, the dividing line may be a linear reference line that divides first cluster data of lithium-precipitated battery cells and second cluster data of non-lithium-precipitated battery cells among standard data at a specific frequency.

Thereafter, the apparatus for inspecting lithium precipitation may determine whether lithium is deposited in the battery cell by using the impedance measurement value of the battery cell measured at a specific frequency and the pre-obtained dividing line at the specific frequency.

According to an embodiment, the apparatus for inspecting lithium precipitation may display impedance measurement values according to eddy currents at a specific frequency on a complex plane in real time. In addition, the apparatus for inspecting lithium precipitation may display a dividing line obtained from standard data corresponding to the specific frequency on the complex plane.

Thereafter, the apparatus for inspecting lithium precipitation may compare positions of real-time impedance measurement values of battery cells located on the complex plane with positions of the first cluster data and the second cluster data with reference to the dividing line.

Here, when the impedance measurement value of the battery cell on the complex plane is present at a point where the first cluster data is located with reference to the dividing line, the apparatus for inspecting lithium precipitation may determine that lithium is precipitated in the battery cell.

On the other hand, if the impedance measurement value of the battery cell on the complex plane based on the dividing line is present at the point where the second cluster data is located with reference to the dividing line, the apparatus for inspecting lithium precipitation may determine that lithium is not precipitated in the battery cell.

According to another embodiment, the apparatus for inspecting lithium precipitation may display a plurality of impedance measurement values according to eddy currents at a specific frequency, collected according to predetermined criteria, on a complex plane. In addition, the apparatus for inspecting lithium precipitation may display a dividing line obtained from standard data corresponding to a corresponding frequency on the complex plane.

Thereafter, the apparatus for inspecting lithium precipitation may analyze positions of impedance measurement data of a plurality of battery cells located on the complex plane. For example, the apparatus for inspecting lithium precipitation may determine whether the measurement data form a cluster. Thereafter, the apparatus for inspecting lithium precipitation may check if the clustered measurement data on the complex plane is located in a similar position to the first cluster data and the second cluster data of the standard data based on the dividing line or an arbitrary reference line having a same slope as that of the dividing line. Here, based on the dividing line, when the impedance measurement value of the battery cell on the complex plane is present at a point where the first cluster data is located, the apparatus for inspecting lithium precipitation may determine that lithium is precipitated in the battery cell.

A method for inspecting lithium precipitation according to embodiments of the present invention has been described above. Hereinafter, a lithium precipitation inspecting experiment of a battery cell, which is performed using the apparatus for inspecting lithium precipitation according to embodiments of the present invention, will be described in detail.

Lithium Precipitation Inspection Experiments According to Experimental Examples of the Present Invention Using the apparatus for inspecting lithium precipitation according to embodiments of the present invention including a coil-type magnetic sensor as a first sensor and an eddy current sensor as a second sensor, lithium precipitation was inspected for a pouch-type lithium-ion battery cell in a form of a bi-directional tab having a battery capacity of 60 Ah.

Here, while a boundary between a positive electrode tab of the battery cell and a electrode plate is placed at the center of the eddy current sensor, and a distance between the boundary of the battery cell and the eddy current sensor is fixed to maintain a 1 mm interval, and the frequency of the first sensor is adjusted to 3200 Hz, 4000 Hz, and 8000 Hz, the impedances of the battery cells for each frequency were individually measured.

Subsequently, as a result of the inspection, experimental data obtained for four battery cells that are determined to have no lithium precipitated and four battery cells that are determined to have lithium precipitated and the standard data at the corresponding frequency were displayed on a single complex plane and compared.

FIG. 12 is an impedance measurement graph of standard data and experimental data when the frequency is 3200 Hz according to a third experimental example of the present invention, FIG. 13 is an impedance measurement graph of standard data and experimental data when the frequency is 4000 Hz according to a fourth experimental example of the present invention, and FIG. 14 is an impedance measurement graph of standard data and experimental data when the frequency is 8000 Hz according to a fifth experimental example of the present invention.

Referring to FIG. 12, when the frequency is 3200 Hz, the experimental data measured by the second sensor on the complex plane are classified and located in a cluster form of the first experimental data and the second experimental data, based on a pre-obtained first dividing line L1.

Here, the first experimental data is impedance measurement data of four battery cells in which it was determined that lithium was precipitated and the second experimental data is impedance measurement data of four battery cells in which it was determined that lithium was not precipitated.

In other words, it was confirmed that the impedance measurement data of the battery cell had a cluster form depending on whether or not lithium was precipitated.

Thereafter, pre-acquired standard data at a frequency of 3200 Hz was plotted on the complex plane, and cluster positions of the first experimental data and the second experimental data were compared.

As a result of the comparison, it was confirmed that the first experimental data and the first standard data were clustered in the first quadrant and the second quadrant located on the upper side with respect to the first dividing line L1, and the second experimental data and the second standard data were clustered in the third and fourth quadrants located on the lower side of the first dividing line L1.

Furthermore, referring to FIG. 13, pre-acquired standard data at a frequency of 4000 Hz was plotted on the same complex plane and the first experimental data and the second experimental data were compared.

As a result of the comparison, it was confirmed that the first experimental data and the first standard data were clustered in the third quadrant located on the left side of the second dividing line L2, and the second experimental data and the second standard data were clustered in the first quadrant located on the right side of the second dividing line L2.

Meanwhile, referring to FIG. 14, it was confirmed that the first experimental data and the second experimental data on the complex plane at a frequency of 8000 Hz did not show any clustering.

Accordingly, it can be confirmed that apparatus for inspecting lithium precipitation according to the embodiments and the experimental examples of the present invention is capable of non-destructive inspection of a battery cell for lithium precipitation (lithium plating) within a specific frequency range.

In the above, the apparatus and the method for inspecting lithium precipitation in the battery cell according to embodiments of the present invention have been described.

An apparatus and method for inspecting lithium precipitation according to embodiments of the present invention forms a magnetic field around a battery cell to be inspected to induce an eddy current and compares measured impedance of the battery cell with standard data to detect lithium plating in the battery cell, thereby providing high stability and reliability.

The operations of the method according to the embodiments of the present invention may be implemented as a computer-readable program or code on a computer-readable recording medium. The computer-readable recording medium includes all types of recording devices in which data readable by a computer system is stored. In addition, the computer-readable recording medium may be distributed in a network-connected computer system to store and execute computer-readable programs or codes in a distributed manner.

In addition, the computer-readable recording medium may include a hardware device, such as a ROM, a RAM, and a flash memory, specially configured to store and execute program instructions. The program instructions may include not only machine language codes such as those generated by a compiler, but also high-level language codes that can be executed by a computer by using an interpreter or the like.

Although some aspects of the invention have been described in the context of the apparatus, it may also represent a description according to a corresponding method, wherein a block or apparatus corresponds to a method step or feature of a method step. Similarly, aspects described in the context of a method may also represent a feature of a corresponding block or item or a corresponding apparatus. Some or all of the method steps may be performed by (or using) a hardware device, such as, for example, a microprocessor, a programmable computer, or an electronic circuit. In some embodiments, one or more of the most important method steps may be performed by such an apparatus.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. An apparatus for inspecting lithium plating in at least one battery cell using eddy current, the apparatus comprising:
   an inspection module including a first sensor for inducing an eddy current in the at least one battery cell and a second sensor for measuring impedance of the at least one battery cell in which the eddy current is induced; and
   a controller configured to determine whether or not lithium plating has occurred in the at least one battery cell by comparing a measured value of the impedance measured by the second sensor with standard data;

wherein the first sensor and the second sensor are provided in a form in which a coil is wound,
wherein the first sensor is configured to induce the eddy current in the at least one battery cell by applying an alternating current (AC) of a specific frequency to the coil to form a magnetic field,
wherein the second sensor is configured to measure an impedance at the specific frequency for the at least one battery cell,
wherein the standard data is pre-verified data obtained by measuring impedance at the specific frequency for a battery cell in which lithium is deposited or for a battery cell in which lithium is not deposited,
wherein controller is configured to compare a position of an impedance value of the at least one battery cell measured by the second sensor on a complex plane with positions of first cluster data and second cluster data based on a dividing line which divides the standard data expressed on the complex plane into the first cluster data and the second cluster data, so as to determine whether lithium is deposited in the at least one battery cell,
wherein the first cluster data is at least one piece of data measured in at least a battery cell in which lithium is deposited, and
wherein the second cluster data is at least one data measured in at least a battery cell in which lithium is not deposited.

2. The apparatus of claim 1, further comprising: a delivery module for delivering the at least one battery cell input from outside of the inspection module.

3. The apparatus of claim 2, wherein the first sensor is located at an upper side with respect to the delivery module, and the second sensor is located at a lower side with respect to the delivery module, and
wherein the first sensor and the second sensor are located on a same vertical line with respect to the delivery module.

4. The apparatus of claim 1, wherein the specific frequency has a value corresponding to any one value between 3190 Hz to 3210 Hz.

5. The apparatus of claim 1, wherein the specific frequency has a value corresponding to any one value between 3990 Hz to 4010 Hz.

6. The apparatus of claim 1, wherein the at least one battery cell is a pouch-type lithium secondary battery cell.

7. The apparatus of claim 1, wherein the at least one battery cell is for being used in an energy storage system (ESS).

8. A method for inspecting lithium plating in at least one battery cell using an inspection module including a first sensor and a second sensor in which a coil is wound, the method comprising:

applying an alternating current (AC) of a specific frequency to the coil in the first sensor to form a magnetic field and induce eddy current in the at least one battery cell;
measuring impedance of the at least one battery cell at the specific frequency using the second sensor; and
determining whether or not lithium plating has occurred in the at least one battery cell by comparing a measured impedance value measures by the second sensor with standard data,
wherein the standard data is pre-verified data obtained by measuring impedance at the specific frequency for a battery cell in which lithium is deposited or for a battery cell in which lithium is not deposited,
wherein determining whether or not lithium plating has occurred in the at least one battery cell includes:
comparing, a position of an impedance value of the at least one battery cell measured by the second sensor on a complex plane with positions of first cluster data and second cluster data based on a dividing line which divides the standard data expressed on the complex plane into the first cluster data and the second cluster data, so as to determine whether lithium is deposited in the at least one battery cell,
wherein the first cluster data is at least one piece of data measured in at least a battery cell in which lithium is deposited, and
wherein the second cluster data is at least one data measured in at least a battery cell in which lithium is not deposited.

9. The method of claim 8, further comprising delivering the at least one battery cell to the inspection module using a delivery module.

10. The method of claim 9, wherein the first sensor is located at an upper side with respect to the delivery module,
wherein the second sensor is located at a lower side with respect to the delivery module, and
wherein the first sensor and the second sensor are located on a same vertical line with respect to the delivery module.

11. The method of claim 8, wherein the specific frequency has a value corresponding to any one value between 3190 Hz to 3210 Hz.

12. The method of claim 8, wherein the specific frequency has a value corresponding to any one value between 3990 Hz to 4010 Hz.

13. The method of claim 8, wherein the at least one battery cell is a pouch-type lithium secondary battery cell.

14. The method of claim 8, wherein the at least one battery cell is used in an energy storage system (ESS).

* * * * *